United States Patent
Lee et al.

(10) Patent No.: US 12,379,413 B2
(45) Date of Patent: Aug. 5, 2025

(54) SEMICONDUCTOR TEST EQUIPMENT AND METHOD OF PERFORMING CURRENT AND VOLTAGE TEST MEASUREMENTS

(71) Applicant: JCET STATS ChipPAC Korea Limited, Incheon (KR)

(72) Inventors: YongJu Lee, Seoul (KR); SeongHyun Kang, Incheon (KR); JiWon Seong, Incheon (KR)

(73) Assignee: JCET STATS ChipPAC Korea Limited (KR)

( * ) Notice: Subject to any disclaimer, the term of this patent is extended or adjusted under 35 U.S.C. 154(b) by 264 days.

(21) Appl. No.: 17/818,520

(22) Filed: Aug. 9, 2022

(65) Prior Publication Data
US 2024/0053400 A1 Feb. 15, 2024

(51) Int. Cl.
*G01R 31/28* (2006.01)
*G01R 1/04* (2006.01)

(52) U.S. Cl.
CPC ....... *G01R 31/2886* (2013.01); *G01R 1/0408* (2013.01); *G01R 31/2879* (2013.01)

(58) Field of Classification Search
CPC ............ G01R 31/2886; G01R 31/2879; G01R 1/0408
See application file for complete search history.

(56) References Cited

U.S. PATENT DOCUMENTS

| | | | | |
|---|---|---|---|---|
| 4,021,718 A | * | 5/1977 | Konrad | G01R 31/3842 340/636.12 |
| 5,390,129 A | * | 2/1995 | Rhodes | G01R 31/31719 324/750.05 |
| 5,579,236 A | * | 11/1996 | Tamamura | G01R 19/25 714/724 |

(Continued)

FOREIGN PATENT DOCUMENTS

| | | | | |
|---|---|---|---|---|
| JP | H06249889 A | * | 9/1994 | G01R 19/25 |
| JP | 08179011 A | * | 7/1996 | G01R 31/2844 |

OTHER PUBLICATIONS

W.W. Sullivan, III et al., "A compact 45 kV curve tracer with picoampere current measurement capability", Rev. Sci. Instrum. 84, 7 pages, Mar. 11, 2013.

(Continued)

*Primary Examiner* — Paresh Patel
(74) *Attorney, Agent, or Firm* — Robert D. Atkins; PATENT LAW GROUP: Atkins and Associates, P.C.

(57) ABSTRACT

A semiconductor test system has a test fixture with a plurality of test sites. Each test site has a DUT placement area and an electrical test circuit dedicated for a DUT to perform voltage and current testing. The electrical test circuit has a voltage measuring block and a current measuring block. The voltage measuring block has an analog-to-digital converter for converting an analog voltage measurement to a digital voltage measurement. The current measuring block has a resistor conducting a current to be (Continued)

measured, an amplifier with a first input and a second input coupled across the resistor, and an analog-to-digital converter with an input coupled to an output of the amplifier and an output for providing a digital current measurement. A test control system controls the test fixture. The electrical test circuit can be an integrated circuit or a discrete circuit.

25 Claims, 7 Drawing Sheets

(56) References Cited

U.S. PATENT DOCUMENTS

| | | | | |
|---|---|---|---|---|
| 5,661,626 | A * | 8/1997 | Takeuchi | G01R 31/3004 307/71 |
| 5,691,648 | A * | 11/1997 | Cheng | G01R 31/2648 324/718 |
| 5,936,419 | A * | 8/1999 | Chen | G01R 31/68 324/536 |
| 6,119,255 | A * | 9/2000 | Akram | G01R 31/2862 714/724 |
| 6,121,787 | A * | 9/2000 | Jacobson | G01R 31/2834 324/762.01 |
| 6,404,220 | B1 * | 6/2002 | Hashimoto | G01R 31/31917 324/750.01 |
| 6,731,127 | B2 * | 5/2004 | Watts | G01R 31/2893 324/759.03 |
| 6,943,576 | B2 * | 9/2005 | Byun | G01R 31/2844 324/73.1 |
| 6,949,576 | B2 * | 9/2005 | Hegde | A01N 43/653 548/266.2 |
| 7,307,433 | B2 * | 12/2007 | Miller | G01R 1/07385 324/756.03 |
| 11,598,806 | B2 * | 3/2023 | Tseng | G01R 31/3172 |
| 2002/0107654 | A1 * | 8/2002 | Mori | G01R 19/2509 702/120 |
| 2004/0017216 | A1 * | 1/2004 | Mardi | G01R 1/0408 324/754.03 |
| 2005/0237073 | A1 * | 10/2005 | Miller | G01R 1/07385 324/756.03 |
| 2006/0002161 | A1 * | 1/2006 | Dangelo | G01R 31/2879 363/147 |
| 2010/0271064 | A1 * | 10/2010 | Kohler | G01R 31/31935 324/750.05 |
| 2014/0266270 | A1 * | 9/2014 | Faehnrich | G01R 31/31924 324/750.01 |
| 2017/0146575 | A1 * | 5/2017 | Limon-Garcia-Viesca | G01R 19/32 |
| 2020/0241071 | A1 | 7/2020 | Ramadass | |
| 2020/0379035 | A1 | 12/2020 | Yun et al. | |

OTHER PUBLICATIONS

Why isn't the TPP1000 (Tektronix Passive Probe 1GHz) compatible with my scope?, https://www.tek.com/en/support/faqs/why-isnt-tpp1000-%28tektronix-passive-probe-1ghz%29-compatible-my-scope, downloaded Jun. 28, 2022, 4 pages.

Current Sense Amplifier Guide 2021, Texas Instruments, https://www.ti.com/lit/sg/slyb194e/slyb194e.pdf?ts=1656428017901&ref_url=https%253A%252F%252Fwww.bing.com%252F; downloaded Jun. 28, 2022, 8 pages.

* cited by examiner

SEMICONDUCTOR TEST EQUIPMENT AND METHOD OF PERFORMING CURRENT AND VOLTAGE TEST MEASUREMENTS

FIELD OF THE INVENTION

The present invention relates in general to semiconductor devices and, more particularly, to semiconductor test equipment and method of performing current and voltage test measurements.

BACKGROUND OF THE INVENTION

Semiconductor devices are commonly found in modern electrical products. Semiconductor devices perform a wide range of functions, such as signal processing, high-speed calculations, transmitting and receiving electromagnetic signals, controlling electrical devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices require testing to establish known good die or known good units (KGD/KGU). Testing is commonly done with general purpose test equipment, e.g., electrical equipment that can perform a wide variety of measurements. One example of general purpose test equipment is a digital multi-meter. The general purpose test equipment is bulky, expensive, and difficult to set up for specific testing, particularly when testing a large number of devices under test (DUT) simultaneously. The cabling alone for the many digital multi-meters can be difficult to arrange and handle. The general purpose test equipment can be unstable, requiring regular maintenance and intervention, and is subject to human error.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
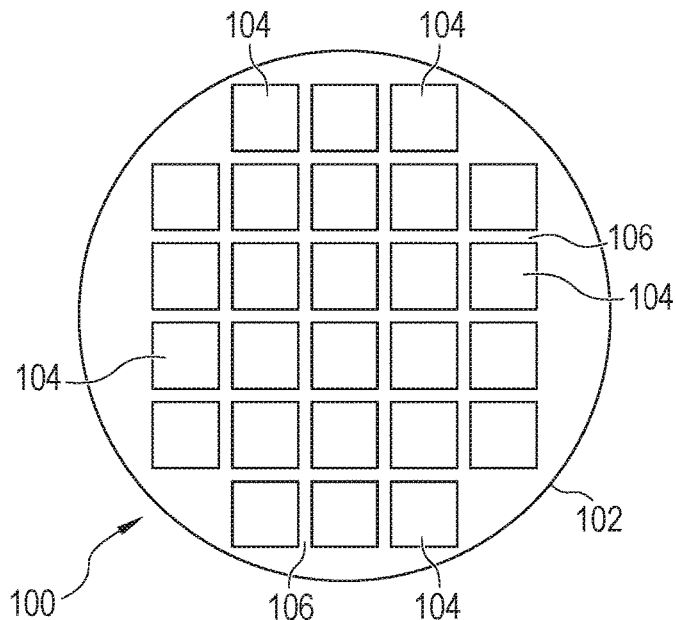
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
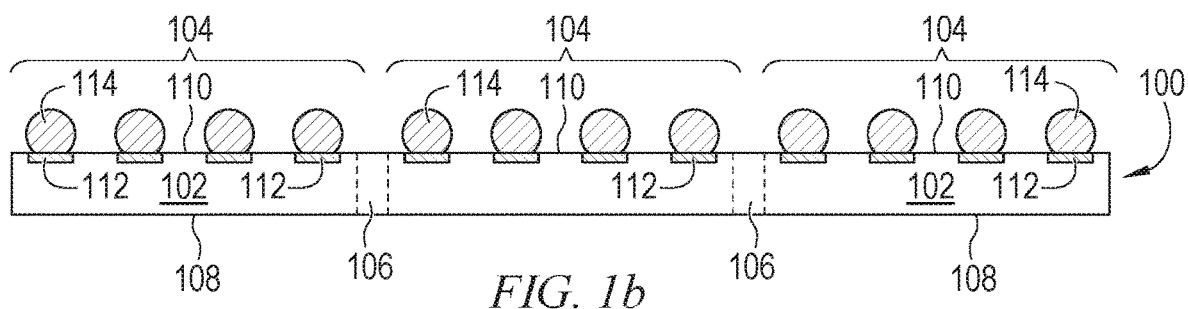

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
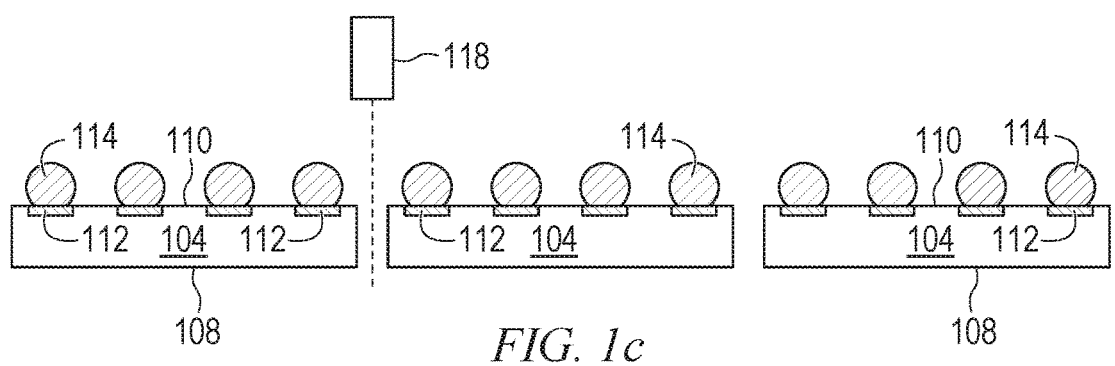

In FIG. 1c, semiconductor wafer 100 is singulated through saw street 106 using a saw blade or laser cutting tool 118 into individual semiconductor die 104. The individual semiconductor die 104 are to be inspected and electrically tested for identification of KGD/KGU post singulation.

Figure 2A:
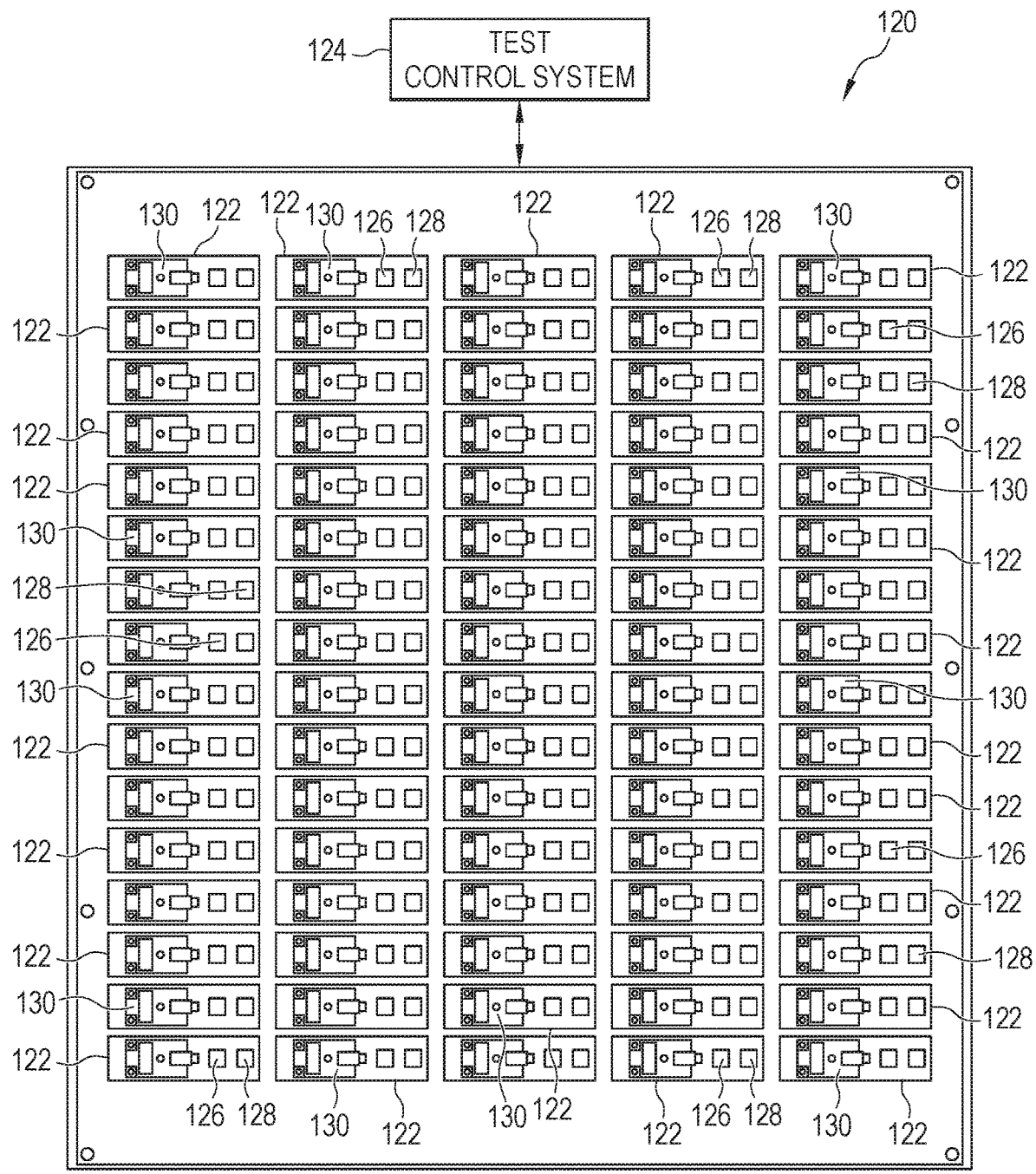
FIGS. 2a-2e illustrate a test fixture with many test sites and a process of disposing DUT on the test fixture.

FIG. 2a shows a test fixture 120 suitable for performing electrical and functional testing of a plurality of semiconductor die 104. Although the following explanation is directed to semiconductor die 104, test fixture 120 can also be used for semiconductor packages and other electrical components. Test fixture 120 includes a plurality of test cells 122. In one example, test fixture 120 has five rows of sixteen test cells 122 per row. Each test cell 122 accommodates one semiconductor die 104, so test fixture 120 can be loaded with up to eighty semiconductor die 104. Test fixture 120 performs electrical and functional testing of up to eighty semiconductor die 104, simultaneously. Test control system 124 provides control and user interface over test fixture 120. The results of the electrical and functional testing of semiconductor die 104 can be downloaded to test control system 124 for analysis and pass/fail determination.

Figure 2B:
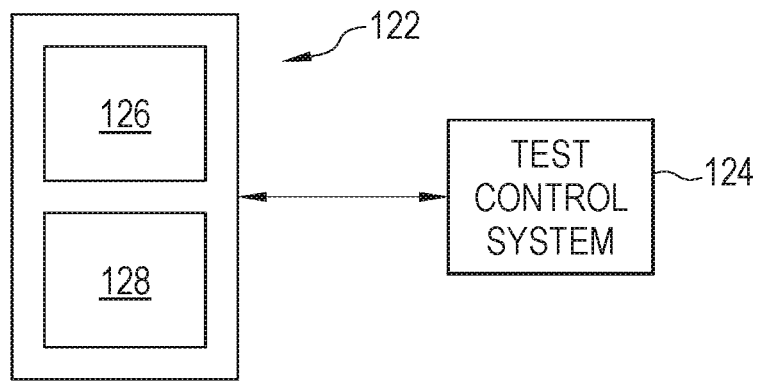

FIGS. 2b-2e illustrate further detail of one test cell 122. Test cell 122 operates under control of test control system 124. Test control system 124 also monitors the output signals of test cell 122, during and after the testing. All eighty test cells 122 in test fixture 120 can have the same configuration. Test control system 124 provides power supply voltages and stimuli signals, if necessary, to each test cell 122. In FIG. 2b, each test cell 122 has a DUT placement area 126 and electrical test circuit 128. Electric test circuit 128 includes circuit components specifically designed and selected to perform electrical and/or functional testing of the DUT. In one example, electric test circuit 128 performs current and voltage testing of the DUT. Electrical test circuit 128 can be implemented as an integrated circuit or discrete electrical components on test cell 122.

Figure 2C:
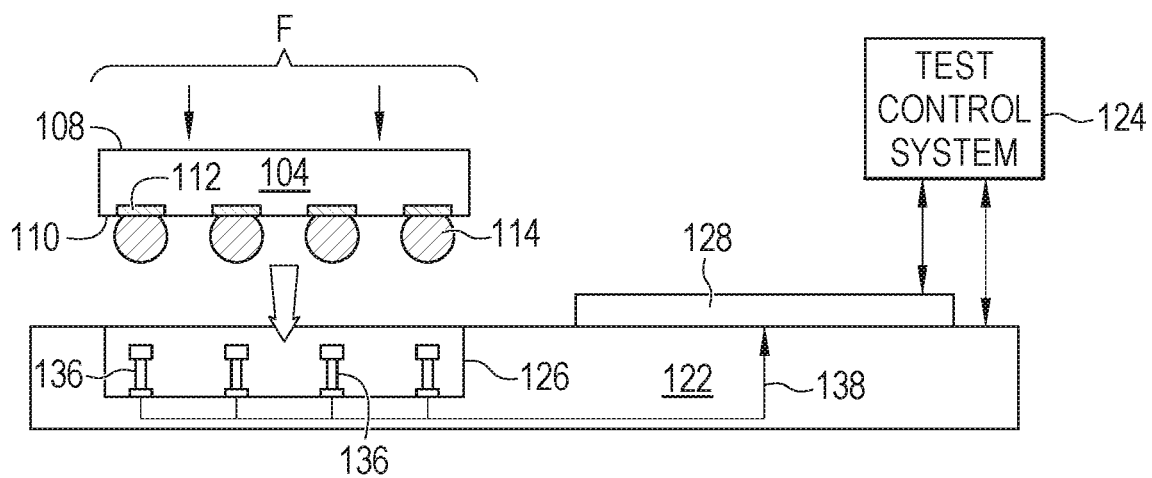
Figure 2D:
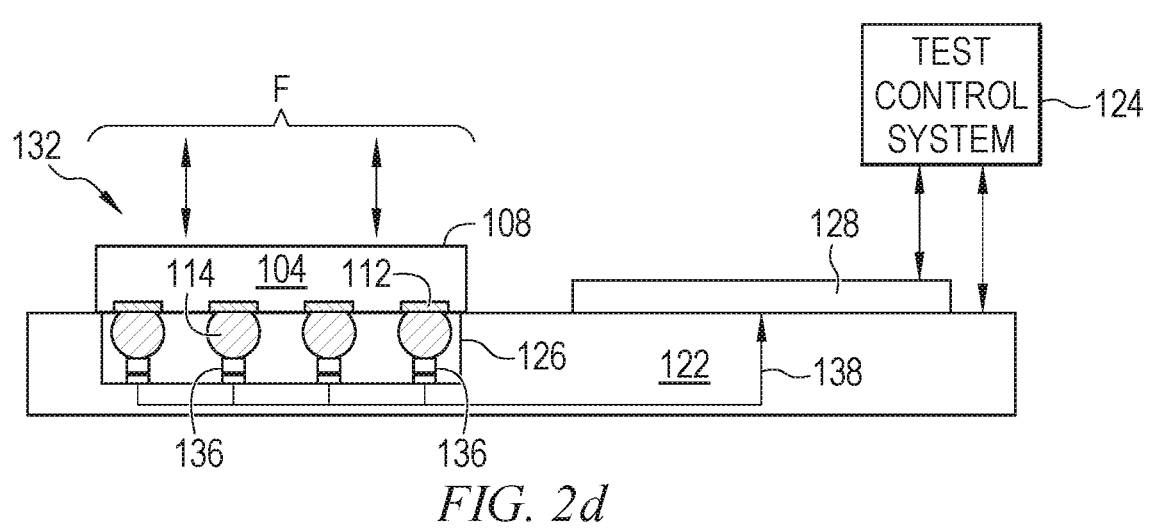
Figure 2E:
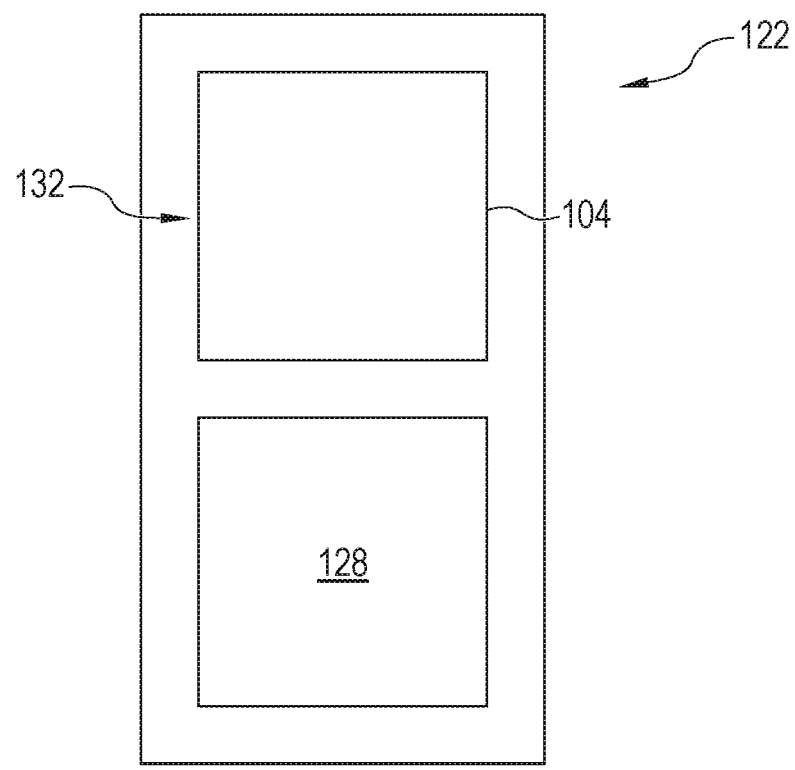

In FIG. 2c, semiconductor die 104 from FIG. 1c is positioned over DUT placement area 126 with bumps 114 oriented toward the DUT placement area. Semiconductor die 104 is brought into contact with test probes or pins 136 in DUT placement area 126. FIG. 2d shows semiconductor die 104 disposed on DUT placement area 126 with bumps 114 contacting and compressing test pins 136 under force F. Semiconductor die 104 disposed in DUT placement area 126 becomes DUT 132. FIG. 2e is a top view of semiconductor die 104 disposed on DUT placement area 126 as DUT 132.

Bumps 114 compress test pins 136 under a force F to make a reliable electrical connection. Test pins 136 connect through conductive channels or wires 138 within test cell 122 to electrical test circuit 128. Test control system 124 is capable of providing power supply voltages and sending stimuli signals to semiconductor die 104 through conductive channels 138 and test pins 136. Electric test circuit 128 sends test measurements to and receives communication protocol from test control system 124. While the test setup shows four conductive channels 138 for simplification, any number of conductive channels can be used for power supply, communications, stimuli, and test output signals. Conductive channels 138 can be routed external with respect to test cell 122 to electric test circuit 128. In one embodiment, test control system 124 can communicate with test cell 122 and electric test circuit 128 using universal serial bus (USB) protocol. The features of FIGS. 2b-2e are implemented eighty times for test fixture 120, once for each test cell 122.

When conducting operational and performance testing of DUTs, real-time voltage and current measurements are highly useful. The voltage and current measurements provide indications of the state of the DUT, as well as pointing to likely problem areas.

Figure 3:
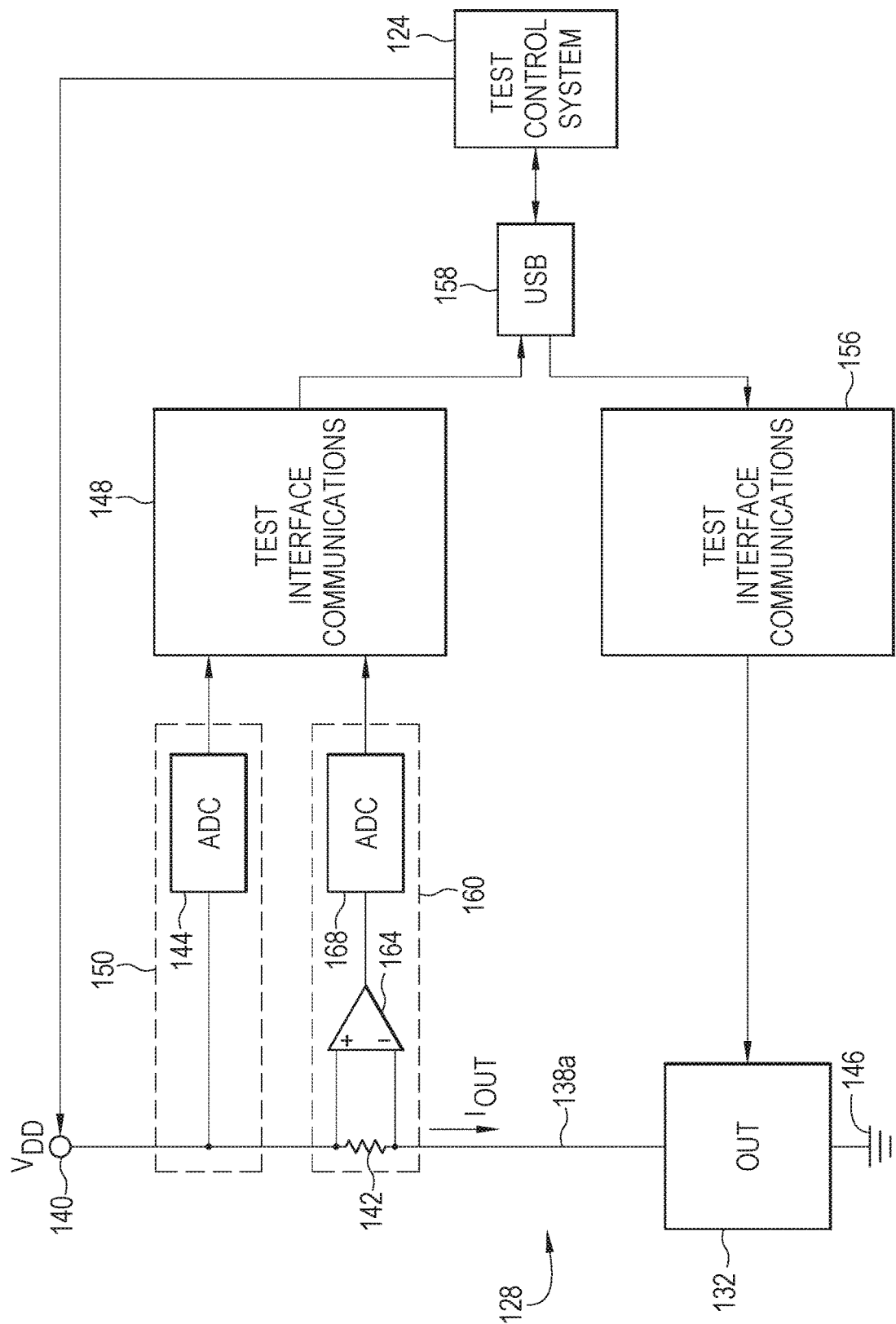
FIG. 3 illustrates a schematic and block diagram of the electrical test circuit.

FIG. 3 shows details of electrical test circuit 128. Test control system 124 provides power supply voltage VDD at node 140. Resistor 142 is coupled between node 140 and conductive channel 138a. In one embodiment, a value for resistor 142 is 0.01 ohms. DUT 132 is coupled to power supply conductor 146 operating at ground potential. An input of analog-to-digital converter (ADC) 144 is coupled to node 140. An output of ADC 144 is coupled to test interface communications device 148. ADC 144 is part of voltage measuring block 150 of electrical test circuit 128. An output of test interface communications device 148 is coupled to USB 158, and the output of USB 158 is coupled to test control system 124. Test control system 124 also communicates through USB 158 and test interface communications device 156 with DUT 132. In one embodiment, test interface communications devices 148 and 156 are Future Technology Device International products. Voltage measuring block 150 performs a voltage measurement of DUT 132, i.e., semiconductor die 104, and communicates the measurement to test control system 124.

Test control system 124 can send commands through USB 158 and test interface communications device 156 to cause DUT 132 to perform one or more functions, e.g., run test sequences. Electrical test circuit 128 can take one or more voltage and current measurements during the test sequences.

Consider a voltage measurement in electrical test circuit 128. In response to power supply voltages and external stimulus from test control system 124, through test cell 122, test pins 136, and conductive channels 138, semiconductor 104 receives an analog voltage VDD. ADC 144 converts the analog voltage to a digital signal and communicates the digital value through test interface communications device 148 and USB 158 to test control system 124. The voltage measurement performed by electrical test circuit 128 is the supply voltage $V_{DD}$ for DUT 132. The supply voltage VDD can be monitored by test control system 124 while DUT 132 is performing one or more functions, e.g., running test sequences. Test control system 124 can thus monitor for variation and pass-fail limits for supply voltage $V_{DD}$ during operation of DUT 132.

Electric test circuit 128 also performs current testing in current measuring block 160. With voltage VDD at node 140, a current $I_{DUT}$ flows through resistor 140, given a properly operating DUT 132. The current $I_{DUT}$ is the consumption current of a properly operating DUT 132. A voltage is developed across resistor 140, given current $I_{DUT}$, and applied across the non-inverting input and inverting input of amplifier 164. The voltage across resistor 140 gets amplified by the gain of amplifier 164, sufficient to be detected by ADC 164. In one embodiment, the gain of amplifier 164 is 50. An input of ADC 168 is coupled to the output of amplifier 164. An output of ADC 168 is coupled to test interface communications device 148. The current measured by electrical test circuit 128 is the consumption current of DUT 132, measured as $I_{DUT}$=V/R, where V is the voltage across resistor 140 and R is the value of resistor 140. The digital current value from ADC 168 is divided by the gain of amplifier 164 to get the true current reading. DUT 132 consumption current $I_{DUT}$ can be monitored by test control system 124 while DUT 132 is performing one or more functions, e.g., running test sequences. Test control system 124 can thus monitor for variation and pass-fail limits for consumption current $I_{DUT}$ during operation of DUT 132.

Test fixture 120 with test sites 122 is particularly useful in performing real-time voltage and current measurements. Testing can be serial or parallel in test fixture 120 with a large number of DUTs 132 being processed simultaneously in parallel or sequentially in series. Monitoring voltage and current in real-time can provide useful information as to the state of DUT 132 and problems can be readily detected and resolved.

Figure 4:
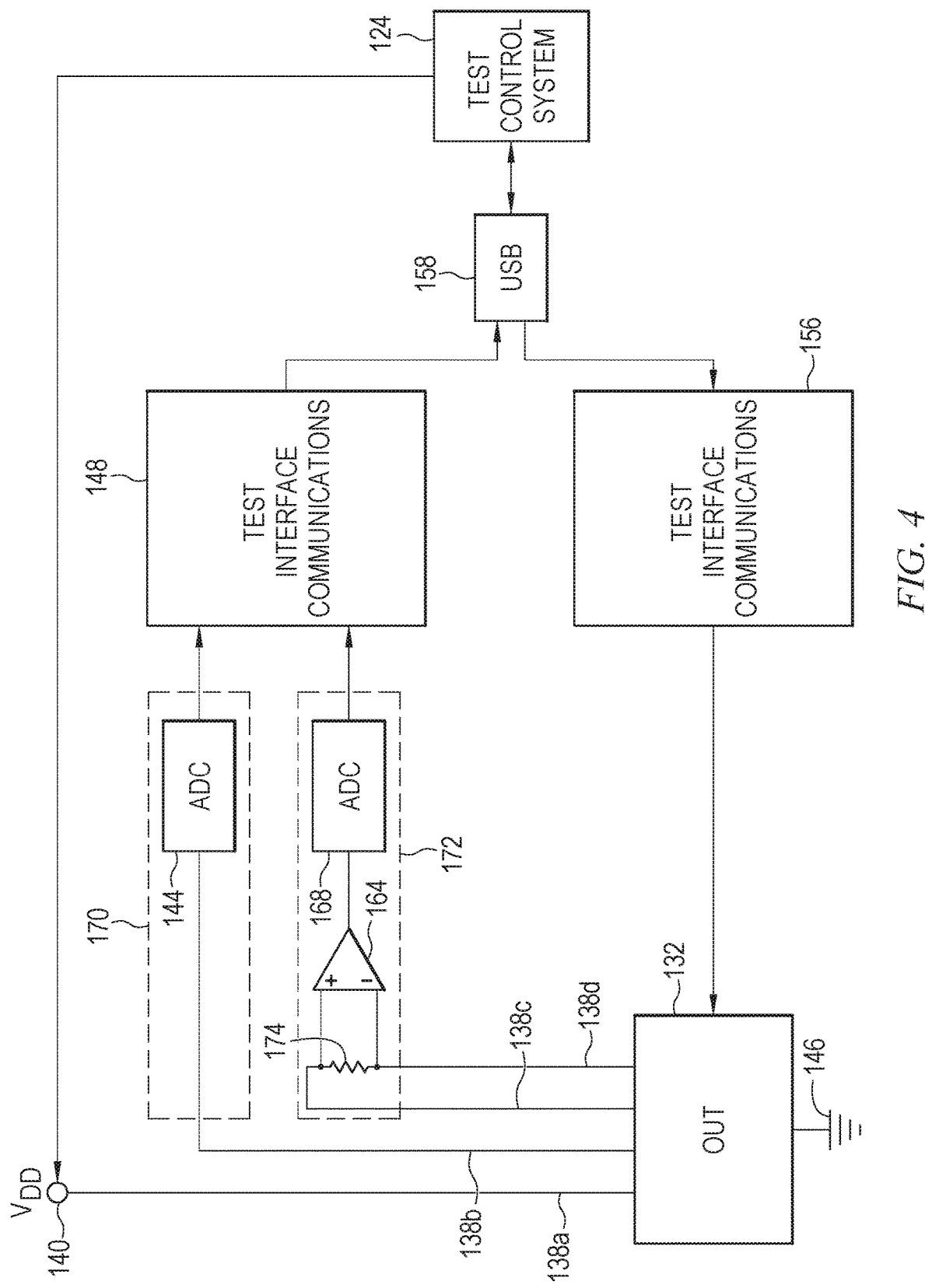
FIG. 4 illustrates another example of the electrical test circuit.

In an alternate embodiment, test control system 124 provides power supply voltage VDD at node 140, as shown in FIG. 4. Power supply voltage VDD is routed to DUT 132 by conductive channel 138a. Elements having a similar function are assigned the same reference number. ADC 144 is part of voltage measuring block 170 of electrical test circuit 128. Voltage measuring block 170 performs a voltage measurement of any output pin of DUT 132, i.e., the DUT pin to be measured or any contact pad 112 by way of conductive channel 138b. ADC 144 converts the analog voltage to a digital signal and communicates the digital value through test interface communications device 148 and USB 158 to test control system 124. The voltage on any DUT pin can be monitored by test control system 124 while DUT 132 is performing one or more functions, e.g., running test sequences. Test control system 124 can thus monitor for variation and pass-fail limits for the voltage at any DUT pin during operation of DUT 132.

In current measuring block 172, a first terminal of resistor 174 is coupled to at least one output pin of DUT 132, e.g., the DUT pin to be measured or in this case conductive channel 138c. A second terminal of resistor 174 is coupled to a second output pin of DUT 132, such as conductive channel 138d, or possibly ground potential. A current $I_{172}$ flows through resistor 172, given a properly operating DUT 132. A voltage is developed across resistor 172, given current $I_{174}$, and applied across the non-inverting input and inverting input of amplifier 164. The voltage across resistor 140 gets amplified by the gain of amplifier 164, sufficient to be detected by ADC 164. The current measured by electrical test circuit 128 is the current from the DUT pin to be measured, e.g., conductive channel 138c, measured as $I_{174}$=V/R, where V is the voltage across resistor 140 and R is the value of resistor 174. The digital current value from ADC 168 is divided by the gain of amplifier 164 to get the true current reading. The current on any DUT pin can be monitored by test control system 124 while DUT 132 is performing one or more functions, e.g., running test sequences. Test control system 124 can thus monitor for variation and pass-fail limits for current on any DUT pin during operation of DUT 132.

DUT 132 can be voltage and current measured in the idle state or during any operational state. Test fixture 120 with test sites 122 is particularly useful in performing real-time voltage and current measurements. Testing can be serial or parallel in test fixture 120 with a large number of DUTs 132 being processed simultaneously in parallel or sequentially in series. Monitoring voltage and current in real-time can provide useful information as to the state of DUT 132 and problems can be readily detected and resolved.

Figure 5:
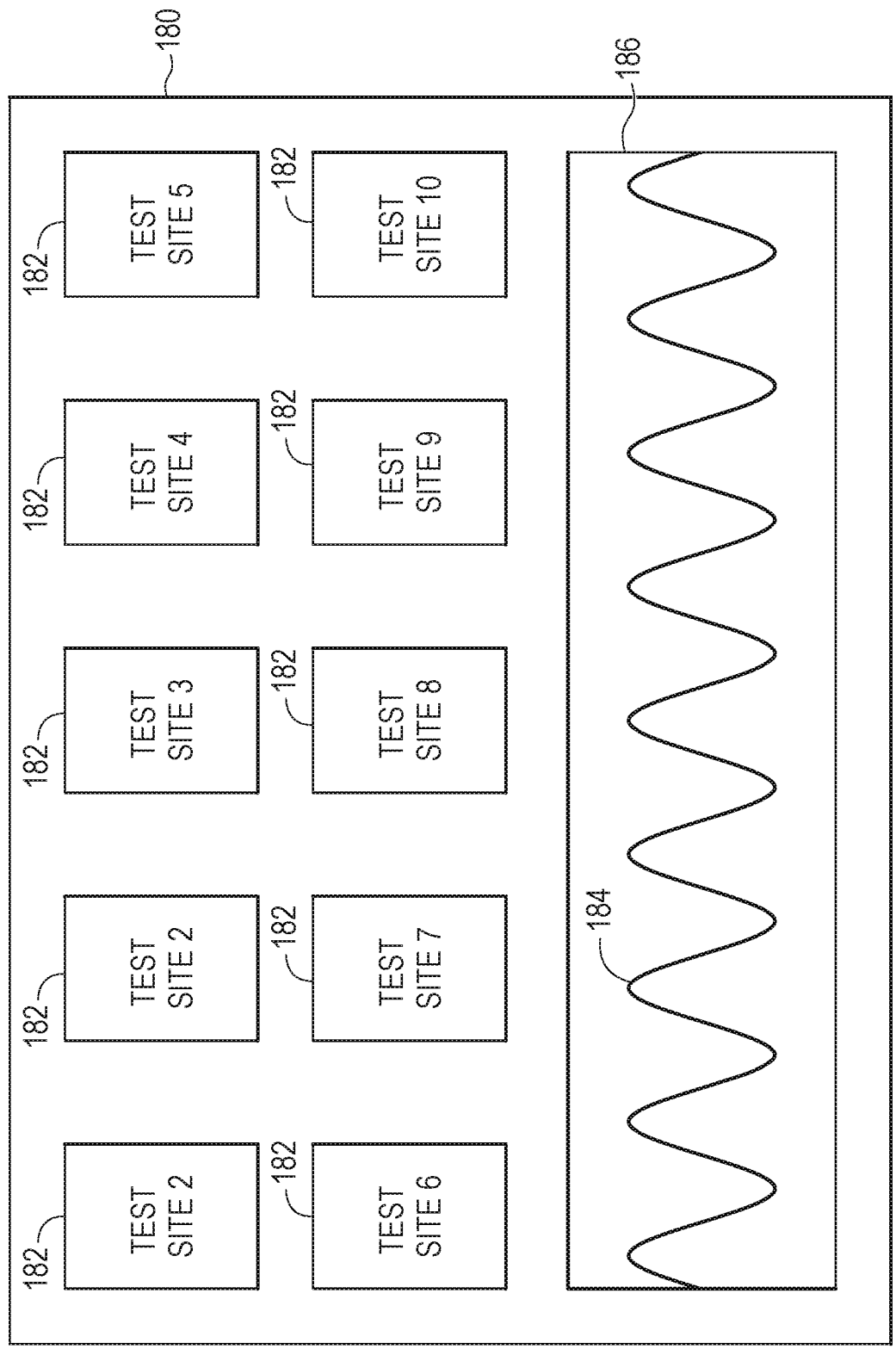
FIG. 5 illustrates a user interface for the test control system.

FIG. 5 illustrates user interface 180 to test control system 124. User interface 180 can display in blocks 182 voltage and current measurements for all eighty test sites 122, pass/fails status, test readings over time in graphs 184 in block 186, control over one or more test sites 122, communication settings, test stimuli settings, and other useful information under software programming.

Test fixture 120 with test control system 124 reduces space requirements since bulky general purpose test equipment can be eliminated. Test fixture 120 and test control system 124 reduces installation and operational costs for testing. Testing is performed automatically and recorded for pass certification and failure analysis.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor test system, comprising:
   a single test fixture including a plurality of test cells disposed on the single test fixture and arranged in parallel rows and columns, wherein each test cell on the single test fixture has the same arrangement including a housing accommodating one and only one device under test (DUT) disposed in a DUT placement area within the housing, and an electrical test circuit disposed within the housing solely dedicated for the one and only one DUT and containing test circuitry dedicated to perform simultaneous, real-time voltage and current testing solely for the one and only one DUT within its test cell; and
   a user interface displaying the real-time voltage and current testing for all test cells simultaneously.

2. The semiconductor test system of claim 1, wherein the electrical test circuit includes a voltage measuring block and a current measuring block.

3. The semiconductor test system of claim 2, wherein the voltage measuring block includes an analog-to-digital converter for converting an analog voltage measurement to a digital voltage measurement.

4. The semiconductor test system of claim 2, wherein the current measuring block includes:
   a resistor conducting a current to be measured;
   an amplifier comprising a first input and a second input coupled across the resistor; and
   an analog-to-digital converter comprising an input coupled to an output of the amplifier and an output for providing a digital current measurement.

5. The semiconductor test system of claim 1, further including a test control system for controlling the test fixture.

6. The semiconductor test system of claim 1, wherein the electrical test circuit includes an integrated circuit.

7. A semiconductor test system, comprising:
   a test fixture including a plurality of test cells, wherein each test cell accommodates one device under test (DUT) and each test cell includes a housing with a DUT placement area for the DUT and a dedicated electrical test circuit within the housing to perform simultaneous, real-time voltage and current testing solely for the DUT within its test cell; and a user interface displaying the real-time voltage and current testing for all test cells simultaneously.

8. The semiconductor test system of claim 7, wherein the electrical test circuit includes a voltage measuring block and a current measuring block.

9. The semiconductor test system of claim 8, wherein the voltage measuring block includes an analog-to-digital converter for converting an analog voltage measurement to a digital voltage measurement.

10. The semiconductor test system of claim 8, wherein the current measuring block includes:
a resistor conducting a current to be measured;
an amplifier comprising a first input and a second input coupled across the resistor; and
an analog-to-digital converter comprising an input coupled to an output of the amplifier and an output for providing a digital current measurement.

11. The semiconductor test system of claim 7, further including a test control system for controlling the test fixture.

12. The semiconductor test system of claim 7, wherein the electrical test circuit includes an integrated circuit.

13. The semiconductor test system of claim 7, wherein the DUT placement area includes test pins for contacting the DUT.

14. A method of testing a semiconductor device, comprising:
providing a test fixture including a plurality of test cells, wherein each test cell accommodates one device under test (DUT) and each test cell includes a housing with a DUT placement area for the DUT and an electrical test circuit within the housing dedicated for the DUT to perform simultaneous, real-time voltage and current testing solely for the DUT within its test cell; and
displaying the real-time voltage and current testing for all test cells on a display simultaneously.

15. The method of claim 14, wherein the electrical test circuit includes providing a voltage measuring block and a current measuring block.

16. The method of claim 15, wherein providing the voltage measuring block includes providing an analog-to-digital converter for converting an analog voltage measurement to a digital voltage measurement.

17. The method of claim 15, wherein providing the current measuring block includes:
providing a resistor conducting a current to be measured;
providing an amplifier comprising a first input and a second input coupled across the resistor; and
providing an analog-to-digital converter comprising an input coupled to an output of the amplifier and an output for providing a digital current measurement.

18. The method of claim 14, further including providing a test control system for controlling the test fixture.

19. The method of claim 14, wherein the electrical test circuit includes an integrated circuit.

20. A method of testing a semiconductor device, comprising:
providing a test fixture including a plurality of test cells, wherein each test cell accommodates one device under test (DUT) and each test cell includes a housing with a DUT placement area for the DUT and a dedicated electrical test circuit to perform simultaneous voltage and current testing solely for the DUT within its test cell; and
displaying the voltage and current testing for all test cells on a display simultaneously.

21. The method of claim 20, wherein the electrical test circuit includes providing a voltage measuring block and a current measuring block.

22. The method of claim 21, wherein providing the voltage measuring block includes providing an analog-to-digital converter for converting an analog voltage measurement to a digital voltage measurement.

23. The method of claim 21, wherein providing the current measuring block includes:
providing a resistor conducting a current to be measured;
providing an amplifier comprising a first input and a second input coupled across the resistor; and
providing an analog-to-digital converter comprising an input coupled to an output of the amplifier and an output for providing a digital current measurement.

24. The method of claim 20, further including providing a test control system for controlling the test fixture.

25. The method of claim 20, wherein the electrical test circuit includes an integrated circuit.

* * * * *